(12) United States Patent
Lee et al.

(10) Patent No.: US 11,227,903 B2
(45) Date of Patent: *Jan. 18, 2022

(54) ORGANIC LIGHT EMITTING DISPLAY DEVICE HAVING A REFLECTIVE BARRIER AND METHOD OF MANUFACTURING THE SAME

(71) Applicant: LG Display Co., Ltd., Seoul (KR)

(72) Inventors: Seong-Joo Lee, Goyang-si (KR); Jeong-Oh Kim, Paju-si (KR); Jung-Sun Beak, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 36 days.

This patent is subject to a terminal disclaimer.

(21) Appl. No.: 16/656,267

(22) Filed: Oct. 17, 2019

(65) Prior Publication Data

US 2020/0052049 A1 Feb. 13, 2020

Related U.S. Application Data

(63) Continuation of application No. 15/824,715, filed on Nov. 28, 2017, now Pat. No. 10,490,613.

(30) Foreign Application Priority Data

Nov. 30, 2016 (KR) .................. 10-2016-0161945

(51) Int. Cl.
| | | |
|---|---|---|
| *H01L 27/32* | (2006.01) | |
| *H01L 51/52* | (2006.01) | |
| *H01L 51/56* | (2006.01) | |

(52) U.S. Cl.
CPC ...... *H01L 27/3244* (2013.01); *H01L 51/5271* (2013.01); *H01L 51/56* (2013.01); *H01L 27/3248* (2013.01)

(58) Field of Classification Search
CPC .............. H01L 27/3244–3279; H01L 51/5271
See application file for complete search history.

(56) References Cited

U.S. PATENT DOCUMENTS

| | | | |
|---|---|---|---|
| 7,227,306 B2 | 6/2007 | Park et al. | |
| 7,776,641 B2 * | 8/2010 | Rhee | H01L 27/3244 438/70 |
| 8,487,310 B2 | 7/2013 | Kang et al. | |
| 8,809,863 B2 | 8/2014 | Kim et al. | |
| 9,029,838 B2 | 5/2015 | Lim et al. | |

(Continued)

FOREIGN PATENT DOCUMENTS

| | | |
|---|---|---|
| CN | 102916031 A | 2/2013 |
| CN | 103904099 A | 7/2014 |

(Continued)

*Primary Examiner* — Stephen M Bradley
(74) *Attorney, Agent, or Firm* — Seed IP Law Group LLP

(57) ABSTRACT

Disclosed are an organic light emitting display device to improve optical efficiency and prevent deterioration in reliability of thin film transistors, and a method of manufacturing the same. The organic light emitting display device includes a mirror wall which is disposed on a substrate such that the mirror wall surrounds a light emitting area of each sub-pixel where a light emitting element is disposed, thus preventing total reflection of light produced in the light emitting element and improving optical efficiency by reflecting light travelling toward a non-emitting area to be directed to the light emitting area.

26 Claims, 10 Drawing Sheets

(56) References Cited

U.S. PATENT DOCUMENTS

| | | | |
|---|---|---|---|
| 9,076,739 | B2 | 7/2015 | Choi et al. |
| 9,136,506 | B2 | 9/2015 | Kim et al. |
| 9,142,793 | B2 | 9/2015 | Choi et al. |
| 9,515,290 | B2 | 12/2016 | Lim et al. |
| 9,536,931 | B2 | 1/2017 | Kim et al. |
| 10,490,613 | B2 * | 11/2019 | Lee ................ H01L 51/56 |
| 2005/0168135 | A1 | 8/2005 | Iga |
| 2009/0091675 | A1 * | 4/2009 | Park .............. G02F 1/134309 349/43 |
| 2010/0096259 | A1 | 4/2010 | Zhang et al. |
| 2010/0102320 | A1 | 4/2010 | Chung et al. |
| 2011/0096259 | A1 | 11/2011 | Lee et al. |
| 2013/0032803 | A1 * | 2/2013 | Moon .............. H01L 27/3248 257/59 |
| 2014/0175393 | A1 * | 6/2014 | Beak .............. H01L 27/3246 257/40 |
| 2014/0291637 | A1 | 10/2014 | Yim et al. |
| 2015/0187854 | A1 | 7/2015 | Beak et al. |

FOREIGN PATENT DOCUMENTS

| | | |
|---|---|---|
| CN | 104078483 A | 10/2014 |
| CN | 104752637 A | 7/2015 |
| CN | 106033800 A | 10/2016 |
| KR | 2003-0052621 A | 6/2003 |

* cited by examiner

ORGANIC LIGHT EMITTING DISPLAY DEVICE HAVING A REFLECTIVE BARRIER AND METHOD OF MANUFACTURING THE SAME

This application is a continuation of U.S. patent application Ser. No. 15/824,715, filed Nov. 28, 2017, which claims the benefit of Korean Patent Application No. 10-2016-0161945, filed on Nov. 30, 2016, which applications are hereby incorporated by reference as if fully set forth herein.

BACKGROUND

Technical Field

The present disclosure relates to an organic light emitting display device and a method of manufacturing the same. More particularly, the present disclosure relates to an organic light emitting display device to improve optical efficiency and prevent deterioration in reliability of thin film transistors, and a method of manufacturing the same.

Description of the Related Art

Image display devices for displaying a variety of information on a screen are significant technologies in the information-technology era and are being developed into slimmer, lighter weight, more portable and higher-functional forms. In response to these requirements, organic light emitting diodes that display an image by controlling the amount of light emitted by an organic light emitting layer attract a great deal of attention as flat panel display devices capable of reducing weight and volume, which are drawbacks of cathode ray tubes. Organic light emitting diodes (OLEDs), which spontaneously emit light, have low power consumption, rapid response speed, high luminous efficacy, high brightness and wide viewing angle.

Organic light emitting diodes include a light emitting element and a pixel circuit which independently operates the light emitting element and includes a plurality of transistors.

Here, when light generated in the light emitting element travels toward a substrate, total reflection occurs in an inner area between the light emitting element and the substrate due to the difference in refractive index between thin films disposed between the light emitting element and the substrate. Accordingly, the light extraction efficiency of light emitted to the rear surface of the substrate is lowered to 20 to 35%. In addition, a part of light generated in the light emitting element travels toward a non-light emitting area, rather than a light emitting area, thus causing deterioration in light extraction efficiency. In addition, when light scattered by total reflection which occurs inside the substrate is incident upon the channel of a thin film transistor included in a pixel circuit, it is difficult to control on/off of the thin film transistor due to photon energy, thus disadvantageously causing deterioration in reliability of the thin film transistor.

BRIEF SUMMARY

Accordingly, the present disclosure is directed to an organic light emitting display device and a method of manufacturing the same that substantially obviate one or more problems due to limitations and disadvantages of the related art.

In various embodiments, the present disclosure provides an organic light emitting display device having improved optical efficiency and that prevents or reduces deterioration in reliability of thin film transistors, and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, provided are an organic light emitting display device which includes a mirror wall which is disposed on a substrate such that the mirror wall surrounds a light emitting area of each sub-pixel where a light emitting element is disposed, thus preventing total reflection of light produced in the light emitting element and improving optical efficiency by collecting light travelling toward a non-emitting area to the light emitting area, and a method of manufacturing the same.

In one embodiment, the present disclosure provides an organic light emitting display device that includes a substrate, a plurality of sub-pixels on the substrate, and a reflective barrier. Each of the sub-pixels includes a light emitting element disposed in a light emitting area, and a pixel circuit disposed in a circuit area and configured to operate the light emitting element. The reflective barrier is disposed overlying the substrate and surrounding a perimeter of the light emitting area of each sub-pixel.

In another embodiment, the present disclosure provides a method of manufacturing an organic light emitting display device that includes: forming a pixel circuit in a pixel area of a sub-pixel on a substrate; forming a light emitting element in a light emitting area of the sub-pixel; and forming a reflective barrier on the substrate, the reflective barrier surrounding a perimeter of the light emitting area.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Figure 1:
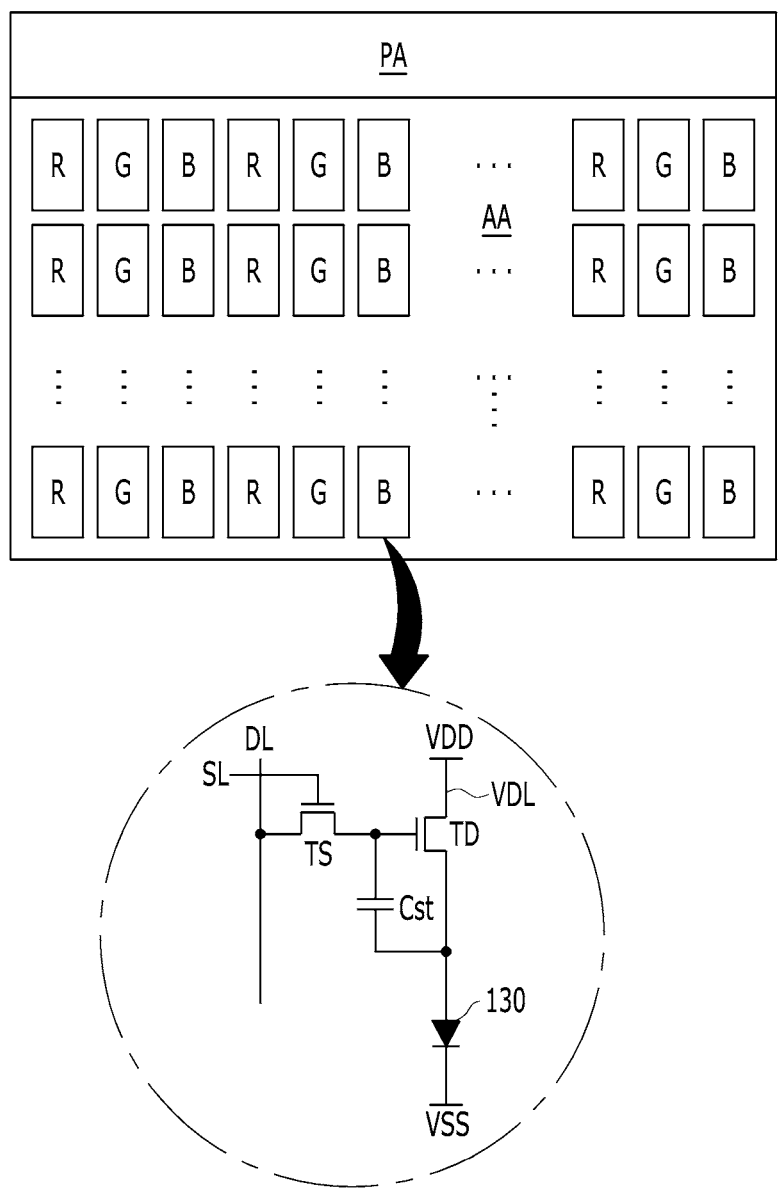
FIG. 1 is a plan view illustrating an organic light emitting display device according to the present disclosure.

FIG. 1 is a plan view illustrating an organic light emitting display device according to the present disclosure.

The organic light emitting display device shown in FIG. 1 includes an active area AA and a pad area PA.

In the pad area PA, a plurality of pads, which each supply a driving signal to a scan line SL, a data line DL, a high-voltage VDD supply line VDL and a low-voltage VSS supply line disposed in the active area AA, are formed.

The active area AA displays an image through a unit pixel including a light emitting element 130. The unit pixel includes red R, green G and blue B sub-pixels, or red R, green G, blue B and white W sub-pixels. Each of the sub-pixels includes a light emitting element 130 and a pixel driving circuit independently operating the light emitting element.

The pixel driving circuit includes a switching transistor TS, a driving transistor TD and a storage capacitor Cst.

When a scan pulse is supplied to the scan line SL, the switching transistor TS is turned on and supplies a data signal supplied to the data line DL to the storage capacitor Cst and a gate electrode of the driving transistor TD.

In response to the data signal supplied to the gate electrode of the driving transistor TD, the driving transistor TD controls a current I supplied from the high-voltage VDD supply line VDL to the light emitting element 130, thereby regulating the amount of light emitted by the light emitting element 130. In addition, although the switching transistor TS is turned off, the voltage charged in the storage capacitor Cst enables the driving transistor TD to supply a constant current I until the data signal of the next frame is supplied, thereby allowing the light emitting element 130 to continuously emit light.

Figure 2:
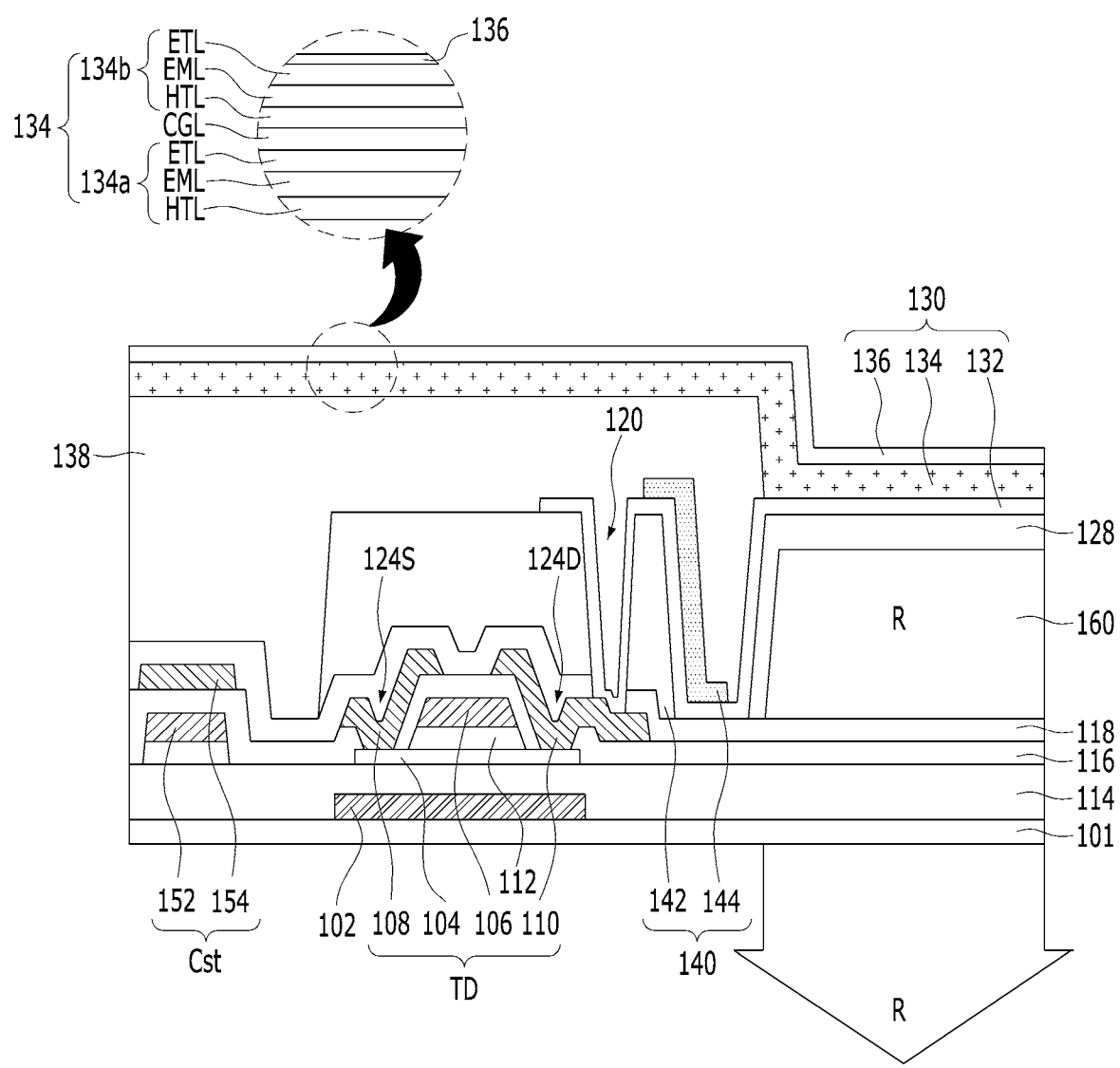
FIG. 2 is a sectional view illustrating a sub-pixel of the organic light emitting display device shown in FIG. 1.

For this purpose, the driving transistor TD includes a gate electrode 106, a source electrode 108, a drain electrode 110 and an active layer 104, as shown in FIG. 2.

The gate electrode 106 is formed on the gate insulation film 112 which is the same pattern as the gate electrode 106. The gate electrode 106 overlaps a channel region of the active layer 104 such that the gate insulation film 112 is interposed therebetween. The gate electrode 106 is formed as a single layer or multiple layers using any one of Mo, Ti, Cu, AlNd, Al and Cr, or an alloy thereof, but the present disclosure is not limited thereto. For example, the gate electrode 106 may have a multilayer stack structure of Cu/MoTi.

The source electrode 108 is connected to the active layer 104 exposed through a source contact hole 124S penetrating the interlayer insulation film 116. The drain electrode 110 is connected to the active layer 104 through a drain contact hole 124D penetrating the interlayer insulation film 116. In addition, the drain electrode 110 is exposed through a pixel contact hole 120 penetrating a protective film 118 and a planarization layer 128 and is connected to the anode 132.

The source electrode 108 and the drain electrode 110 are, for example, formed as a single layer or multiple layers using any one of Mo, Ti, Cu, AlNd, Al and Cr, or an alloy thereof, but the present disclosure is not limited thereto.

The active layer 104 overlaps the gate electrode 106 via the gate insulation film 112 interposed therebetween, to form a channel between the source and drain electrodes 108 and 110. This active layer 104 is formed using at least one of an amorphous semiconductor material, a polycrystalline semiconductor material and an oxide semiconductor material.

A buffer film 114 and a light-shielding layer 102 are formed between the active layer 104 and the substrate 101. The light-shielding layer 102 overlaps the active layer 104 on the substrate 101. Since the light-shielding layer 102 absorbs or reflects light emitted from the outside, it can block exterior light from entering the active layer 104. The light-shielding layer 102 is formed using a non-transparent metal such as Mo, Ti, Al, Cu, Cr, Co, W, Ta or Ni.

The buffer film 114 is formed as a single or multiple layer structure using silicon oxide or silicon nitride on the substrate 101, which may be made of glass or a plastic resin such as polyimide (PI). The buffer film 114 prevents diffusion of moisture or impurities in the substrate 101 or controls transfer rate of heat upon crystallization, thereby facilitating crystallization of the active layer 104.

The storage capacitor Cst is formed by a storage lower electrode 152 that is overlapped by a storage upper electrode 154, with the interlayer insulation film 116 disposed between the storage lower and upper electrodes 152, 154. The storage lower electrode 152 is formed on the same layer as the gate electrode 106 using the same material as the gate electrode 106, and the storage upper electrode 154 is formed on the same layer as the drain electrode 110 using the same material as the drain electrode 110. The storage lower electrode 152 is connected to the drain electrode 110 of any one of the switching transistor TS and the driving transistor TD, and the storage upper electrode 154 is connected to the drain electrode 110 of the other of the switching transistor TS and driving transistor TD. Although the switching transistor TS is turned off, the voltage charged in the storage capacitor Cst enables the driving transistor TD to supply a constant current until the data signal of the next frame is supplied, thereby allowing the light emitting element 130 to continuously emit light.

The light emitting element 130 includes an anode 132 connected to the drain electrode 110 of the driving transistor TD, at least one light emitting stack formed on the anode 132 and a cathode 136 formed on the light emitting stack such that the cathode is connected to the low-voltage VSS supply line. Here, the low-voltage VSS supply line supplies a low-voltage VSS lower than the high-voltage VDD supplied through the high-voltage supply line VDL.

The anode 132 contacts the drain electrode 110 exposed through the pixel contact hole 120 penetrating the protective film 118 and the planarization layer 128. The anode 132 is formed on the planarization layer 128 such that it is exposed in a light emitting region provided by a bank 138. That is, the bank 138 defines boundaries of the light emitting region. In a case where the anode 132 is applied to a bottom emission type organic light emitting display device, the anode 132 is formed as a transparent conductive layer such as an indium-tin-oxide (ITO) or indium-zinc-oxide (IZO) layer.

The light emitting stack 134 is formed by stacking a hole transport layer HTL, an organic light emitting layer EML and an electron transport layer ETL in this order or a reverse order on the anode 132. In addition, the light emitting stack 134 may include first and second light emitting stacks 134a and 134b which face each other with a charge generation layer CGL interposed therebetween. In this case, the organic light emitting layer EML of any one of the first and second light emitting stacks 134a and 134b generates blue light and the organic light emitting layer EML of the other of the first and second light emitting stacks 134a and 134b generates yellow-green light, thereby combining to generate white light through the first and second light emitting stacks 134a and 134b.

The cathode 136 is formed on upper and side surfaces of the organic light emitting layer 134 and the bank 138 such that the cathode 136 faces the anode 132 with the organic light emitting layer 134 interposed therebetween. In a case where the cathode 136 is applied to a bottom emission type organic light emitting display device, the cathode 136 has a multilayer structure including a transparent conductive film and a non-transparent conductive film having high reflectivity. The transparent conductive film is formed using a material having a high work-function value such as indium-tin-oxide (ITO) or indium-zinc-oxide (IZO), and the non-transparent conductive film is formed as a single layer or multiple layers using any one of Mo, Ti, Cu, AlNd, Al and Cr, or an alloy thereof For example, the cathode 136 has a structure in which a transparent conductive film, a non-transparent conductive film and a transparent conductive film are sequentially stacked.

The color filter 160 is disposed on the protective film 118 such that the color filter 160 overlaps the light emitting region provided or defined by the bank 138. Any one of red R, green G, and blue B color filters is disposed in the light emitting region of each sub-pixel. That is, the red color filter 160 is disposed in the red R sub-pixel, the green color filter 160 is disposed in the green G sub-pixel and the blue color filter 160 is disposed in the blue B sub-pixel. Accordingly, when white light generated in the light emitting stack 130 passes through the color filter 160, the color filter 160 renders light of the color corresponding to the color filter 160. Meanwhile, the color filter 160 may extend so as to cover or at least partially cover at least one of the switching and driving film transistors TS and TD.

As such, when the light emitting stack 134 produces white light, white light generated in the light emitting stack 134 is incident upon the color filter 160, thus forming a color image. On the other hand, without the color filter 148, a color image can be formed by producing light of a color corresponding to each sub-pixel SP by each light emitting stack 134. That is, the light emitting stack 134 of the red sub-pixel SP can produce red light, the light emitting stack 134 of the green sub-pixel SP can produce green light, and the light emitting stack 134 of the blue sub-pixel SP can produce blue light.

The planarization layer 128 is formed using a transparent organic insulation material such as an acrylic resin on the substrate provided with the color filter 160. The planarization layer 128 serves as a white color filter in the white sub-pixel region where the color filter 160 is not formed.

Figure 3A:
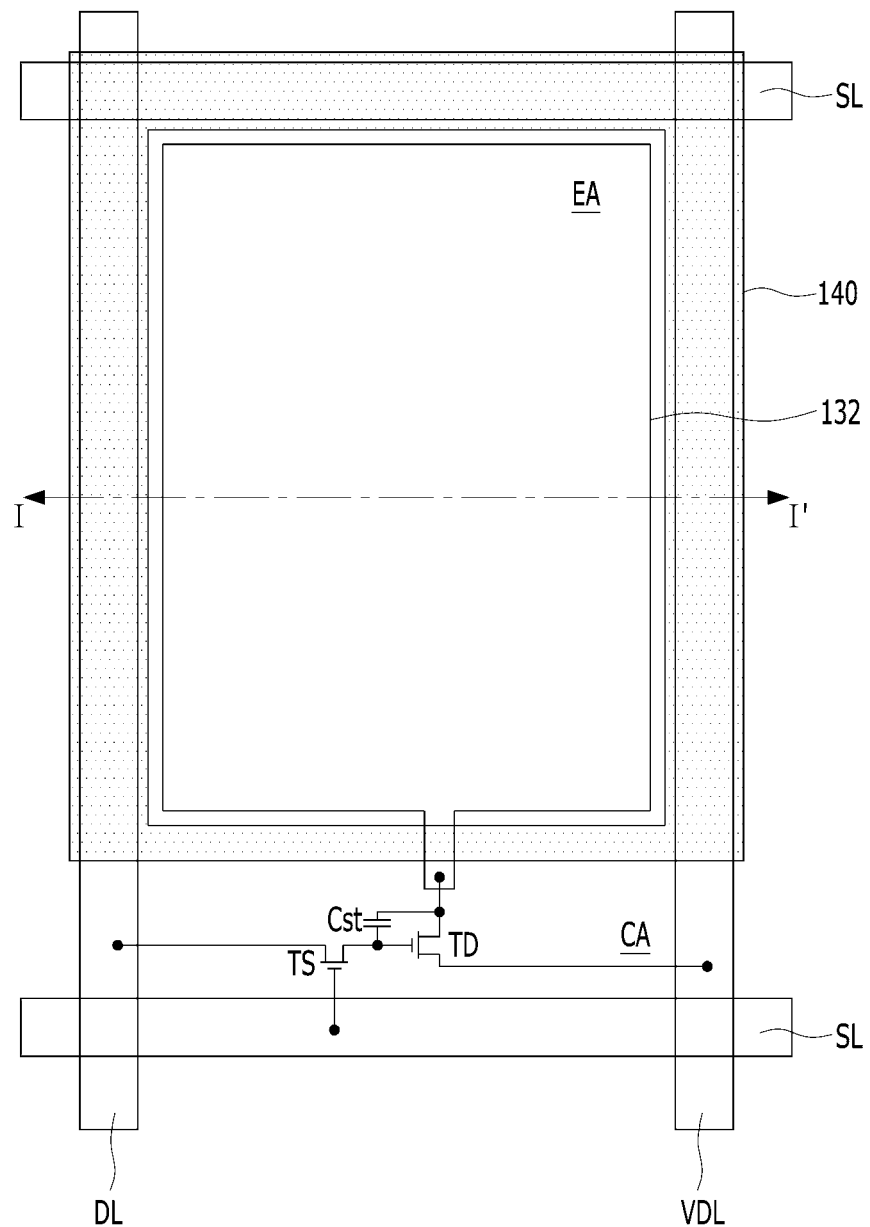
FIGS. 3A and 3B are plan views illustrating embodiments of a sub-pixel of the organic light emitting display device shown in FIG. 2.
Figure 3B:
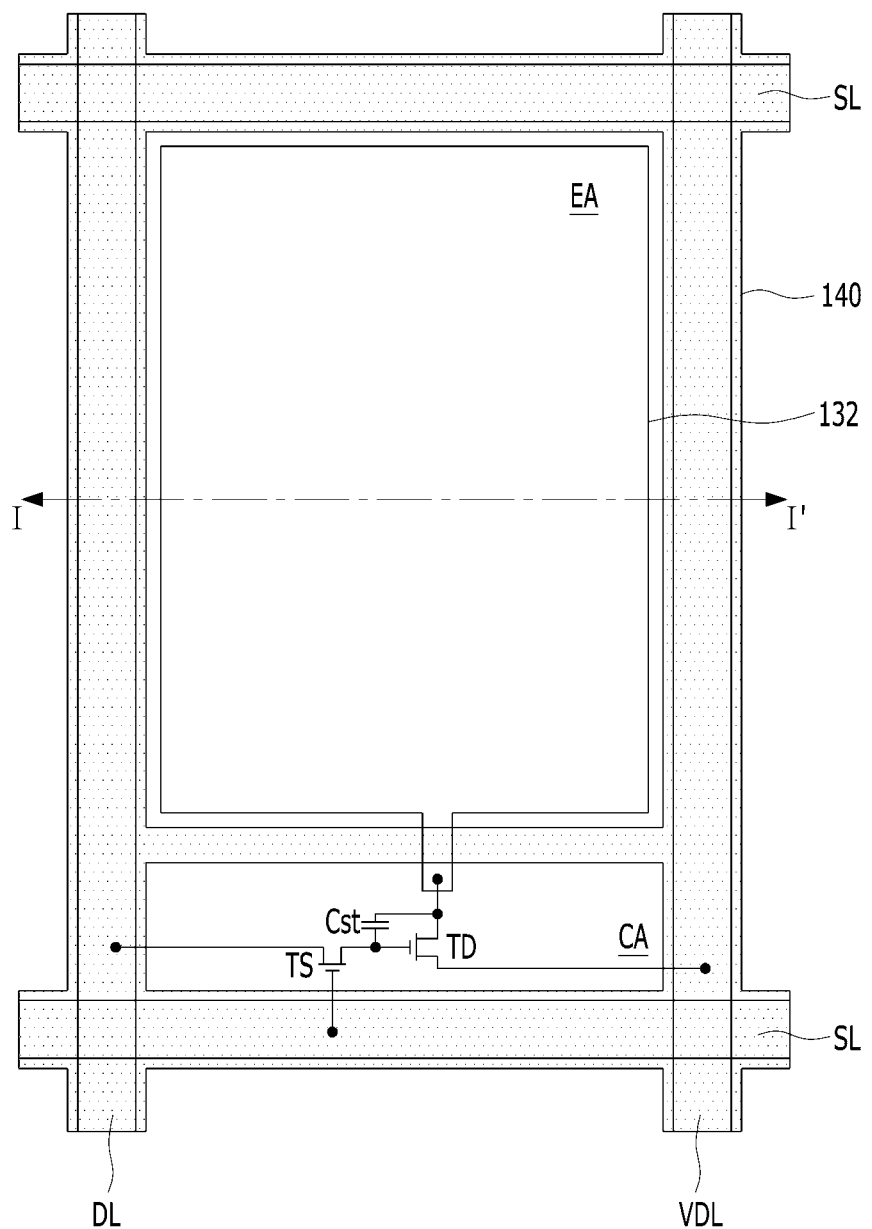

Meanwhile, the present disclosure includes a reflective barrier 140 which surrounds a perimeter of a light emitting area EA of each sub-pixel, as shown in FIG. 3A, or which surrounds the perimeter of the light emitting area EA and a perimeter of a circuit area CA, as shown in FIG. 3B.

The reflective barrier 140 includes an insulation layer 142 and a reflective layer 144 disposed on the insulation layer 142. The reflective barrier 140 may be referred to herein as a "mirror wall," as the reflective barrier 140 may have a mirror-like reflective surface that reflects light. Similarly, the reflective layer 144 may be referred to herein as a "mirror layer." The insulation layer 142 may be referred to herein as an "insulation wall." It should be readily appreciated that the insulation layer 142 or "insulation wall" may include a plurality of walls having a height and that surround a perimeter of one or more of the light emitting area EA and the circuit area CA, as described herein.

The insulation wall 142 overlaps a plurality of signal lines which cross each other to provide respective sub-pixel areas and is disposed between the light emitting area EA and the circuit area CA of each sub-pixel. For example, as shown in FIGS. 3A and 3B, the mirror wall 140 and the insulation wall 142 may overlap a data line DL disposed along a first direction (e.g., in a vertical direction, as shown) and therefore faces the left side of each of the light emitting area EA and the circuit area CA, as shown. The insulation wall 142 overlaps a high-voltage supply line VDL parallel to the data line DL and therefore faces the right side of each of the light emitting area EA and the circuit area CA, as shown. The insulation wall 142 overlaps a scan line SL in a second direction crossing the first direction (e.g., in a horizontal direction, as shown) and therefore faces the upper side of the light emitting area EA and the lower side of the circuit area CA, and the insulation wall 142 may be disposed between the light emitting area EA and the circuit area CA and therefore faces the lower side of the light emitting area EA and the upper side of the circuit area CA. Accordingly, the insulation wall 142 surrounds the perimeter of the light emitting area EA of each sub-pixel, as shown in FIG. 3A, and the insulation wall 142 may further surround the perimeter of the circuit area CA of each sub-pixel, as shown in FIG. 3B.

The reflective barrier or mirror wall 140, including the insulation wall 142 and the reflective layer or mirror layer 142, is described herein as surrounding a perimeter of one or both of the light emitting area EA and the circuit area CA of the sub-pixels. It should be readily appreciated that the mirror wall 140 may surround a perimeter of one or both of the light emitting area EA and the circuit area CA without surrounding, for example, a lower or upper portion of the light emitting area EA and the circuit area CA. Further, the term surrounds a perimeter is not intended to impart any height or width limitations, and is sufficiently broad to cover embodiments where the mirror wall 140 has a height that is less than, equal to, or greater than a height of portions of the light emitting area EA and the circuit area CA that form the perimeters.

The insulation wall 142 is formed on the protective film 118, and may be formed on the same plane as the planarization layer 128, using the same material as the planarization layer 128. In this case, the side surface of the insulation wall 142 forms an acute or right angle with the upper surface of the protective film 118.

Figure 4:
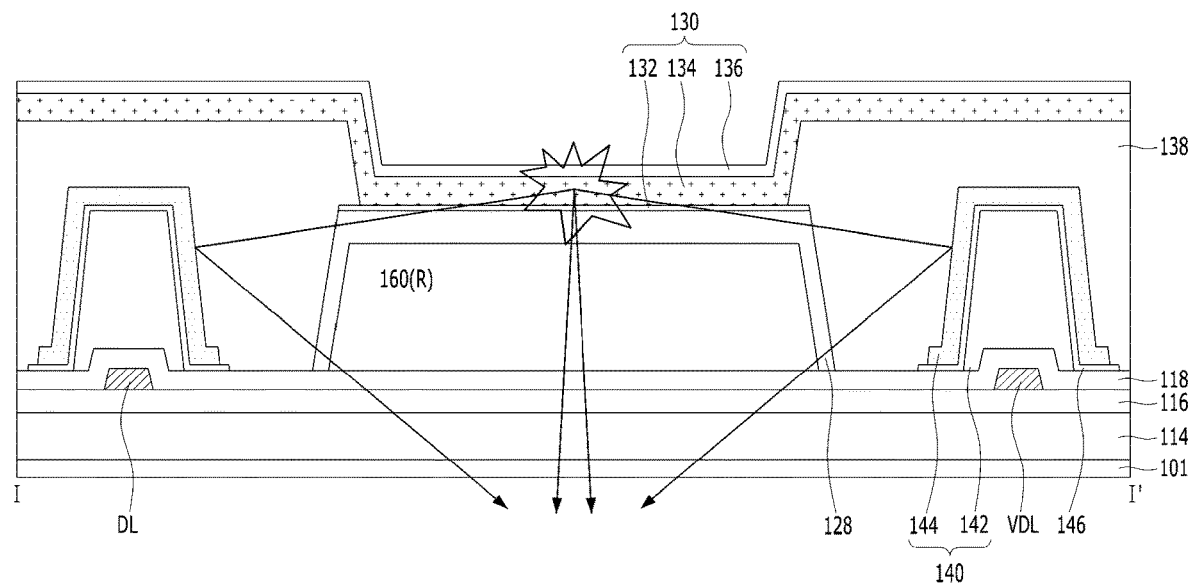
FIG. 4 is a sectional view taken along line "I-I", of the organic light emitting display device shown in FIGS. 3A and 3B.
Figure 5A:
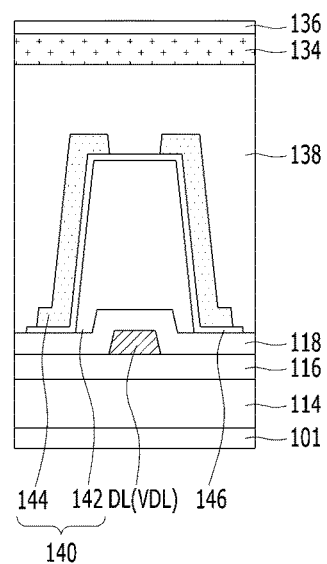
FIGS. 5A and 5B are sectional views illustrating various embodiments of a mirror wall shown in FIG. 4.
Figure 5B:
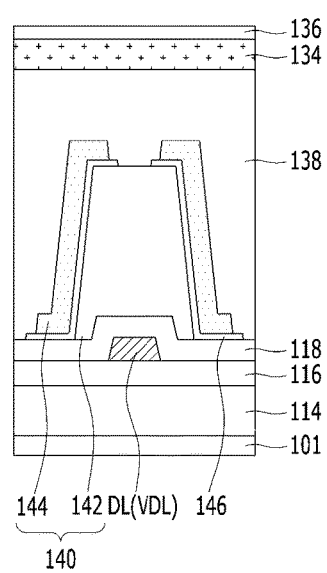

The mirror layer 144 is formed on the side surfaces of the insulation wall 142. That is, since the side surface of the insulation wall 142 overlapping the drain electrode 110 of the driving transistor overlaps the mirror layer 144 via the anode 132, as shown in FIG. 2, the mirror layer 144 is connected to the anode 132. In addition, since the side surface of the insulation wall 142 which overlaps the signal line including the data line DL, the high-voltage supply line VDL and the scan line SL overlaps the mirror layer 144 via the transparent layer 146, as shown in FIG. 4, the mirror layer 144 contacts the transparent layer 146 which is in a floating state. In particular, the mirror layer 144 disposed on the signal line including the data line DL, the high-voltage supply line VDL and the scan line SL covers both side surfaces and the upper surface of the insulation wall 142, as shown in FIG. 4. In addition, in one or more embodiments, the mirror layer 144 disposed on the signal line covers a part of the upper surface and the side surface of the insulation wall 142 while not overlapping the upper surface of each signal line, as shown in FIGS. 5A and 5B. That is, the mirror layer 144 may extend over only a portion of the upper surface of the insulation wall 142, and a portion of the insulation wall 142 that is not covered by the mirror layer 144 may correspond with the signal line which is formed under the insulation wall 142, as shown in FIGS. 5A and 5B.

The mirror layer 144 may be formed of any reflective material that reflects light. The mirror layer 144 may be formed using the same material as the cathode 136, which may have reflectivity, or may be formed of an insulation, semiconductor or metal material having reflectivity. For example, the mirror layer 144 may be formed as a single layer or multiple layers using any one of molybdenum (Mo), aluminum (Al), chromium (Cr), gold (Au), titanium (Ti), nickel (Ni), neodymium (Nd), copper (Cu) and APC (Ag; Pb; Cu), or an alloy thereof.

The mirror layer 144 has reflectivity and therefore changes a passage of light total-reflected through the cathode 136, thus reducing light loss due to total reflection. In addition, the mirror layer 144 reflects light, which travels toward the outside of the light emitting area EA, that is, toward the non-light emitting area, to the light emitting area EA, thereby improving optical efficiency of light emitted through the light emitting area EA of the substrate 101. In particular, the upper surface of the mirror layer 144 disposed on the insulation wall 142 is disposed in a higher plane, e.g., relative to a surface of the substrate 101, than the lower surface of the light emitting stack 134 contacting the anode 132. Accordingly, light which is produced from the light emitting stack 134 and travels in a direction parallel or nearly parallel to the length direction of the light emitting stack 136 (that is, a direction perpendicular to the thickness direction of the light emitting stack 136) is reflected by the mirror layer 144 and is redirected to the light emitting area EA, thereby improving optical efficiency. Furthermore, the mirror layer 144 on the insulation wall 142 disposed between the light emitting area EA and the circuit area CA reflects light, which travels toward the switching and driving transistors TS and TD, to the light emitting area EA, thereby preventing deterioration in reliability of the switching and driving transistors TS and TD.

Meanwhile, the transparent layer 146 is disposed between the mirror layer 144 and the insulation wall 142. The transparent layer 146 is formed by the same mask process as the anode 132 and the mirror layer 144. Accordingly, both ends of the transparent layer 146 correspond to both ends of the mirror layer 144, and the transparent layer 146 is formed on the same plane as the anode 132 using the same material. As shown in FIG. 4, the mirror layer 144 may cover the upper and side surfaces of the insulation wall 142, or as shown in FIGS. 5A and 5B, the mirror layer 144 may cover a part of the upper surface and the side surface of the insulation wall 142, while not overlapping the upper surface of each signal line.

As such, the present disclosure can prevent total reflection of light produced in the light emitting stack 134 and thus improve optical efficiency because the mirror layer 144 formed on the insulation wall 142 changes a route of the light produced in the light emitting stack 134. In addition, the present disclosure can improve optical efficiency because the mirror layer 144 formed on the insulation wall 142 collects light travelling toward the non-light emitting area to the light emitting area. Furthermore, the present disclosure can prevent deterioration in reliability of the switching and driving transistors TS and TD because the mirror layer 144 formed on the insulation wall 142 blocks light which is produced in the light emitting element 130 from traveling toward the switching and driving transistors TS and TD.

FIGS. 6A to 6I are sectional views illustrating a method of manufacturing the organic light emitting display device shown in FIG. 4. Meanwhile, the method of manufacturing the organic light emitting display device shown in FIGS. 6A to 6I will be described in conjunction with the organic light emitting display device shown in FIG. 4 as well as the organic light emitting display device shown in FIG. 2.

Figure 6A:
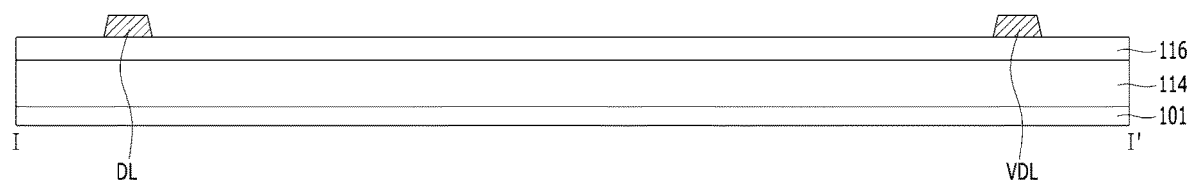
FIGS. 6A to 6I are sectional views illustrating a method of manufacturing the organic light emitting display device shown in FIG. 4.

Referring to FIG. 6A, a light-shielding layer 102, a switching transistor TS, a driving transistor TD, a storage capacitor Cst, a high-voltage supply line VDL and a data line DL are formed on a substrate 101 by five or fewer mask processes.

More specifically, the light-shielding layer 102 is formed on the substrate 101 by a first mask process. Here, the light-shielding layer 102 is formed as a single layer using a metal material such as Mo, Ti, Cu, AlNd, Al or Cr, or an alloy thereof, or as multiple layers using the same. A buffer film 114 is formed on the substrate 101 provided with the light-shielding layer 102, and an active layer 104 is formed on the buffer film 114 by a second mask process. Then, at the same time, by a third mask process, a gate insulation pattern 112 is formed on the buffer film 114 provided with the active layer 104, and a scan line SL, a gate electrode 106 and a storage lower electrode 152 are formed on the gate insulation pattern 112. Then, an interlayer insulation film 116 having source and drain contact holes 124S and 124D is formed on the substrate 101 provided with the scan line SL, the gate electrode 106 and the storage lower electrode 152 by a fourth mask process. Then, a data line DL, a high-voltage supply line VDL, a source electrode 108, a drain electrode 110 and a storage upper electrode 154 are formed on the substrate 101 provided with the interlayer insulation film 116 by a fifth mask process.

Figure 6B:
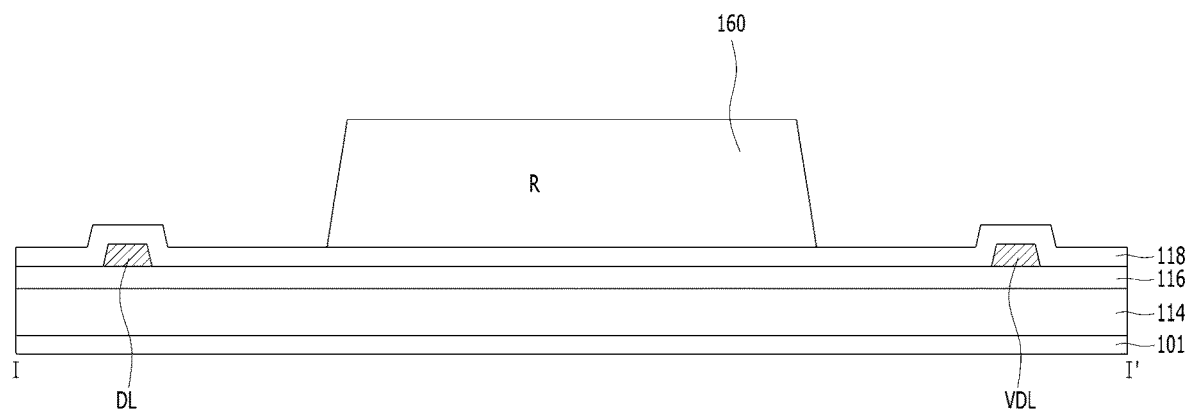

Then, an inorganic insulation material such as $SiO_x$ or SiNx is deposited over the entire surface of the interlayer insulation film 116 provided with the data line DL, the high-voltage VDL supply line, the source electrode 108, the drain electrode 110 and the storage upper electrode 154 to form a protective film 118 as shown in FIG. 6B. Then, the substrate 101 provided with the protective film 118 is coated with a colored resin and the colored resin is then patterned by a sixth mask process to form a color filter 160.

Figure 6C:
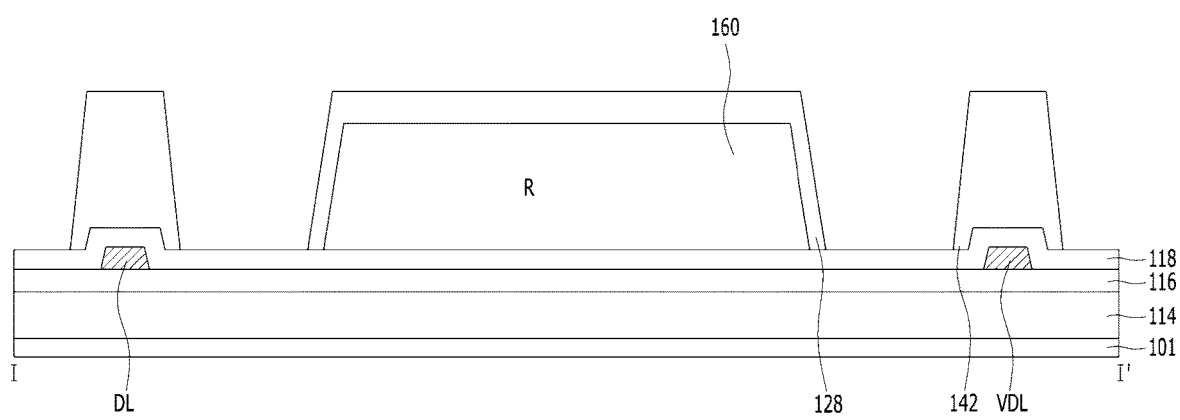

An organic film such as a photoacrylic resin is coated over the entire surface of the substrate 101 provided with color filter 160 and is then patterned by a seventh mask process, to form an insulation wall 142, a planarization layer 128 and a pixel contact hole 120, as shown in FIG. 6C.

Figure 6D:
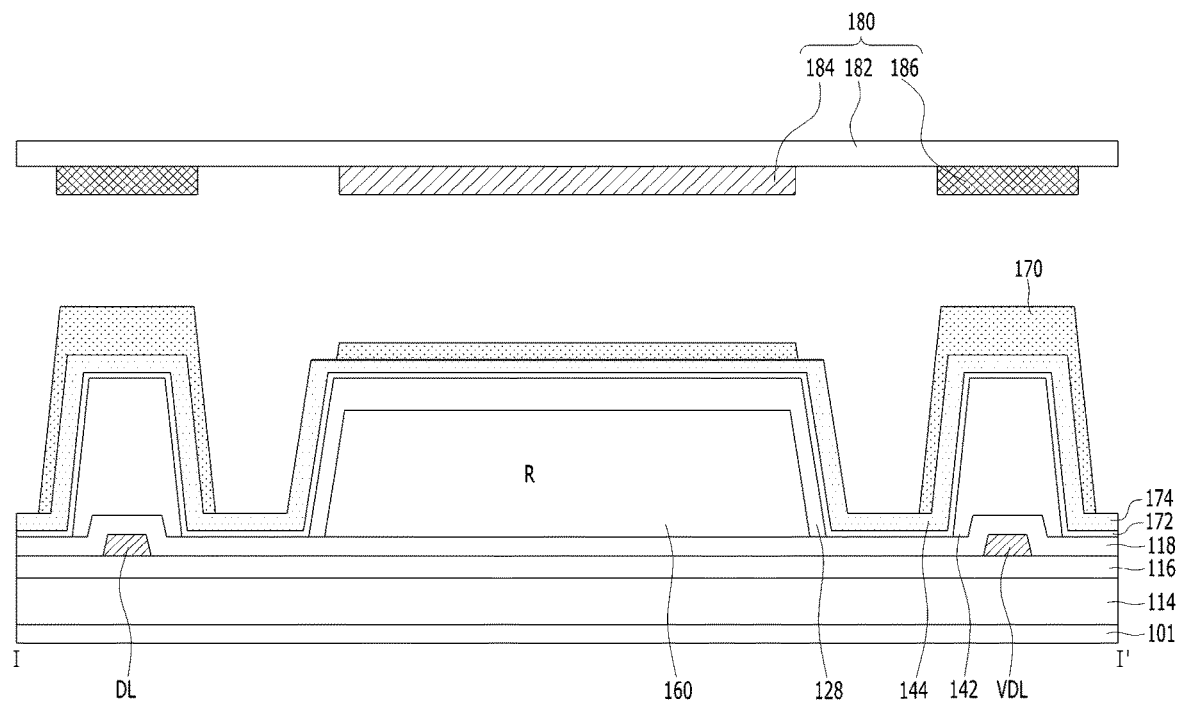

Then, first and second conductive layers 172 and 174 and a photoresist are sequentially deposited over the entire surface of the substrate 101 provided with the insulation wall 142, the planarization layer 128 and the pixel contact hole 120, as shown in FIG. 6D. Then, an eighth mask 180 having a light-shielding part 186 and a semi-transmission part 184 on a mask substrate 182 is arranged on the substrate 101 provided with the photoresist. The photoresist is patterned by a photolithography process using this eighth mask to form a multi-step photoresist pattern 170. In this case, the photoresist pattern 170 is formed to have a first thickness in a region where the photoresist pattern 170 overlaps the semi-transmission part 184 and to have a second thickness greater than the first thickness in a region where the photoresist pattern 170 overlaps the light-shielding part 186.

Figure 6E:
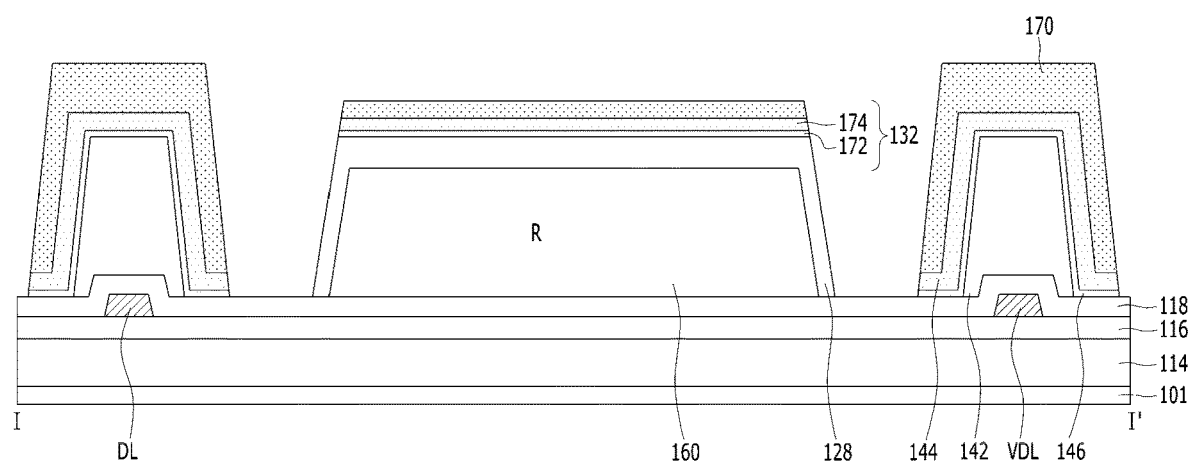

Then, the first and second conductive layers 172 and 174 are patterned by an etching process using the multi-step photoresist pattern 170 as a mask, to form a transparent layer 146 including the first conductive layer 172, a mirror layer 144 including the second conductive layer 174, and an anode 132 including the first and second conductive layers 172 and 174, as shown in FIG. 6E.

Figure 6F:
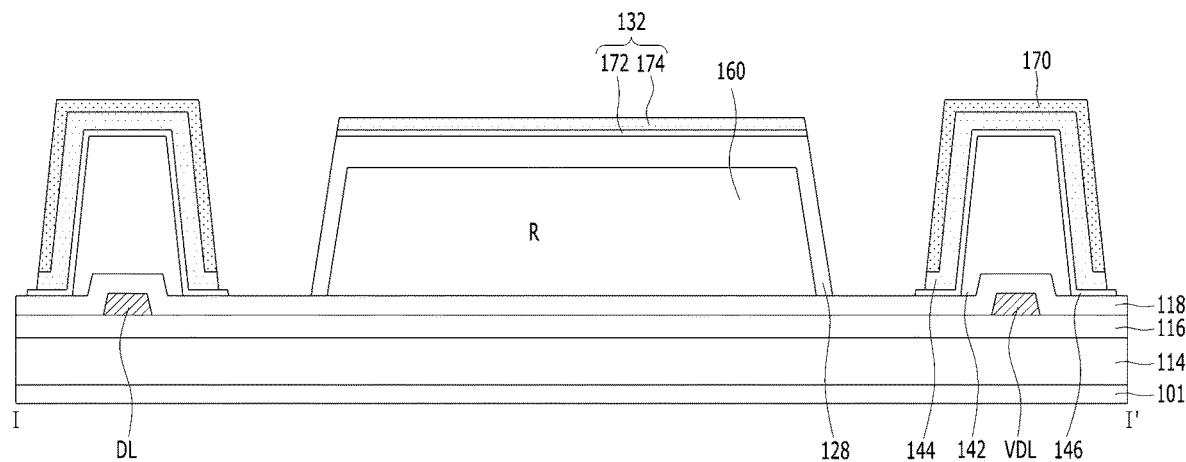
Figure 6G:
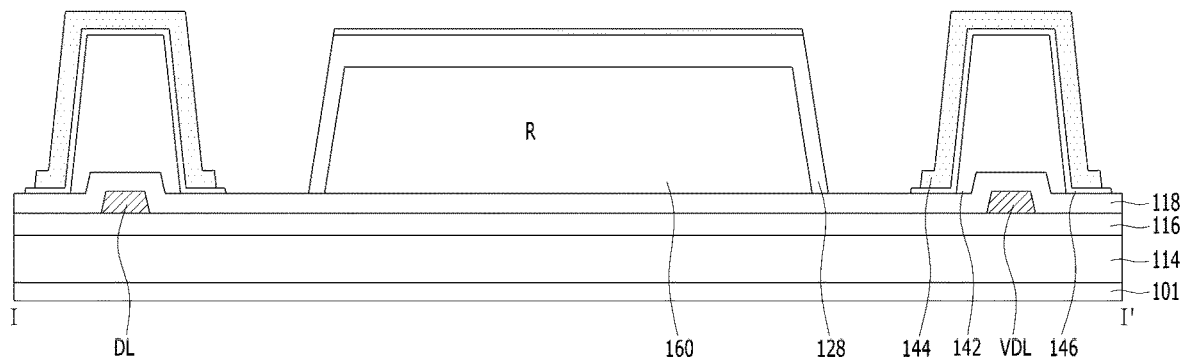

Then, the multi-step photoresist pattern 170 is ashed, so that the thickness of the photoresist pattern 170 having a second thickness on the mirror layer 144 is reduced and the photoresist pattern 170 having the first thickness on the anode 132 is removed, to expose the second conductive layer 174 of the anode 132, as shown in FIG. 6F. The exposed second conductive layer 174 is removed by an etching process using the ashed photoresist pattern 170 as a mask to form the anode 132 as the first conductive layer 172, as shown in FIG. 6G. Then, photoresist pattern 170 remaining on the mirror wall 140 is removed by a stripping process. The upper surface of the mirror layer 144 is thus formed at a higher level above the surface of the substrate 101 than the upper surface of the anode 132 in the light emitting area.

Figure 6H:
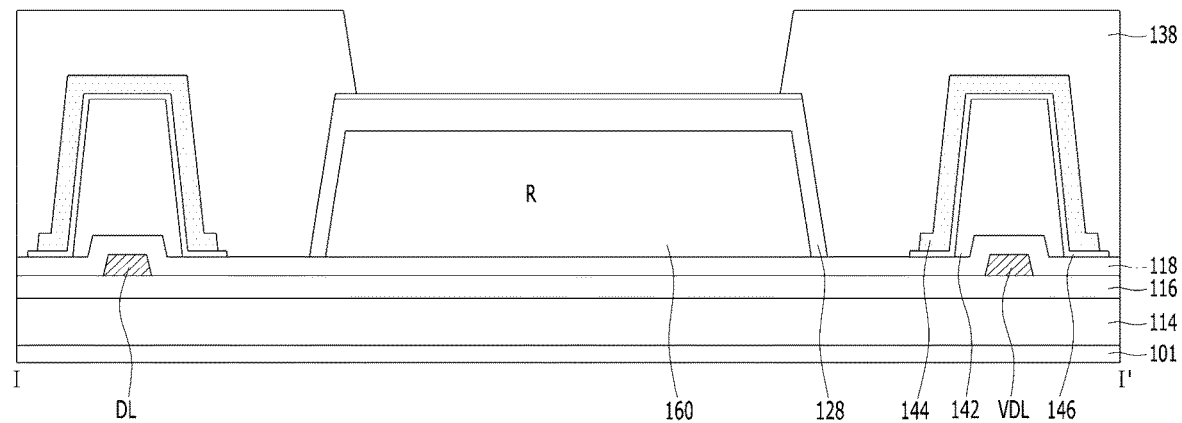
Figure 6I:
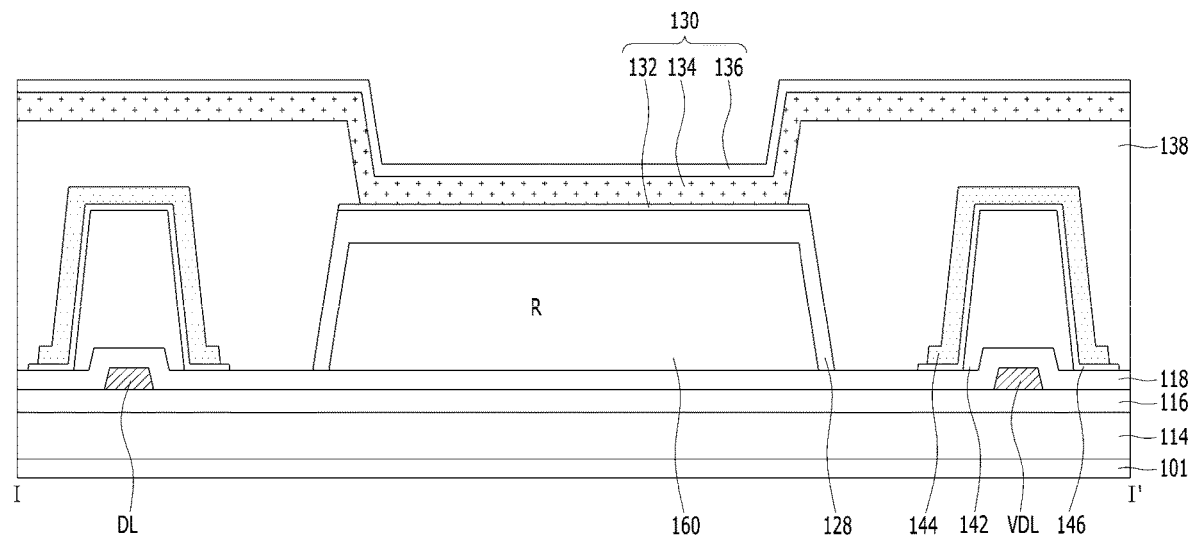

Then, a photosensitive organic film is deposited over the entire surface of the substrate 101 provided with the transparent layer 146, the mirror layer 144 and the anode 132, and the photosensitive organic film is patterned by a photolithography process using a ninth mask to form a bank 138, as shown in FIG. 6H. A light emitting stack 134 rendering white light and a cathode 136 are sequentially formed on the substrate 101 provided with the bank 138 by a deposition process using a shadow mask, as shown in FIG. 6I.

As such, the method of manufacturing the organic light emitting display device according to the present disclosure can prevent an increase in the number of processes because the insulation wall 142 is formed by the same mask process as the planarization layer 128, and the mirror layer 144 and the transparent layer 146 are formed by the same mask process as the anode 132.

According to the present disclosure, the mirror wall including the insulation wall and the mirror layer disposed on the insulation wall surrounds the light emitting area. Accordingly, the present disclosure can prevent total reflection of light produced in the light emitting stack and thus improve optical efficiency because the mirror layer changes a route of the light produced in the light emitting stack. In addition, the present disclosure can improve optical efficiency because the mirror layer formed on the insulation wall reflects light travelling toward the non-light emitting area to be redirected toward the light emitting area. Furthermore, the present disclosure can prevent deterioration in reliability of the switching and driving transistors because the mirror layer formed on the insulation wall blocks light which is produced in the light emitting element from traveling toward the switching and driving transistors.

In addition, it will be apparent to those skilled in the art that various modifications and variations can be made in the present disclosure without departing from the spirit or scope of the disclosure. Accordingly, the embodiments described in the present disclosure are not limited to the present disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device comprising:
   a substrate;
   a sub-pixel on the substrate including a light emitting element disposed in a light emitting area;
   a reflective barrier overlying the substrate and surrounding a perimeter of the light emitting area of the sub-pixel, the reflective barrier including:
   an insulation layer surrounding the perimeter of the light emitting area of the sub-pixel, the insulation layer having an upper surface, a first side surface facing the light emitting area of the sub-pixels, and a second side surface spaced laterally apart from the first side surface;
   a reflective layer disposed on the upper surface, the first side surface, and the second side surface of the insulation layer; and
   a bank disposed on the reflective barrier.

2. The organic light emitting display device according to claim 1, wherein a light produced in the light emitting element passes through the bank, is reflected by the reflective layer disposed on the first side surface of the insulation layer, and is emitted toward a viewing plane.

3. The organic light emitting display device according to claim 1, further comprising:
   a transparent layer disposed between the insulation layer and the reflective layer.

4. The organic light emitting display device according to claim 3, further comprising:
   a color filter disposed between the substrate and the light emitting element; and
   a planarization layer on the color filter,
   wherein the insulation layer and the planarization layer are formed of a same material and are disposed on a same plane, and
   the transparent layer and an anode of the light emitting element are formed of a same material and are disposed on a same plane.

5. The organic light emitting display device according to claim 1, further comprising:
   a pixel circuit disposed in a circuit area, the pixel circuit configured to operate the light emitting element,
   wherein the reflective barrier surrounds a perimeter of the circuit area of the sub-pixel.

6. The organic light emitting display device according to claim 5, further comprising:
   a transparent layer disposed between the insulation layer and the reflective layer.

7. The organic light emitting display device according to claim 5, wherein the insulation layer extends between the light emitting area and the circuit area of the sub-pixel.

8. The organic light emitting display device according to claim 6, further comprising:
   a color filter disposed between the substrate and the light emitting element; and
   a planarization layer on the color filter,
   wherein the insulation layer and the planarization layer are formed of a same material and are disposed on a same plane, and
   the transparent layer and an anode of the light emitting element are formed of a same material and are disposed on a same plane.

9. The organic light emitting display device according to claim 1, wherein the reflective layer is formed using a same material as a cathode of the light emitting element.

10. The organic light emitting display device according to claim 1, wherein the reflective layer is formed as a single layer or multiple layers including at least one of molybdenum (Mo), aluminum (Al), chromium (Cr), gold (Au), titanium (Ti), nickel (Ni), neodymium (Nd), copper (Cu) and APC (Ag; Pb; Cu), or an alloy thereof.

11. The organic light emitting display device according to claim 1, further comprising:
a pixel circuit disposed to operate the light emitting element,
wherein the pixel circuit comprises:
a driving transistor connected to the light emitting element; and
a switching transistor connected to the driving transistor.

12. The organic light emitting display device according to claim 11, further comprising:
a scan line connected to a gate electrode of the switching transistor;
a data line connected to a source electrode of the switching transistor; and
a high-voltage supply line connected to a source electrode of the driving transistor,
wherein the reflective barrier overlaps with the scan line, the data line and the high-voltage supply line.

13. The organic light emitting display device according to claim 11, wherein the light emitting element comprises:
an anode connected to the driving transistor;
a cathode facing the anode; and
a light emitting stack disposed between the anode and the cathode,
wherein an upper surface of the reflective layer disposed on the insulation layer is disposed on a higher plane relative to the substrate than a lower surface of the light emitting stack contacting the anode.

14. The organic light emitting display device according to claim 13, wherein the reflective barrier is disposed between the light emitting area and a circuit area in which the pixel circuit is disposed, and
wherein the reflective layer and the cathode reflect light produced in the light emitting stack toward the substrate.

15. The organic light emitting display device according to claim 1, wherein the reflective layer completely covers the upper surface of the insulation layer between the first side surface and the second side surface.

16. The organic light emitting display device according to claim 1, wherein the reflective layer partially covers the upper surface of the insulation layer, a portion of the upper surface of the insulation layer being uncovered by the reflective layer.

17. The organic light emitting display device according to claim 1, further comprising:
a pixel circuit disposed to operate the light emitting element,
a data line electrically coupled to the pixel circuit and disposed adjacent to a first side of the light emitting area; and
a high-voltage supply line electrically coupled to the pixel circuit and disposed adjacent to a second side of the light emitting area that is opposite the first side,
wherein the insulation layer of the reflective barrier is disposed on the data line and the high-voltage supply line, and portions of the upper surface of the insulation layer overlapping the data line and the high-voltage supply line are uncovered by the reflective layer.

18. The organic light emitting display device according to claim 1, wherein the reflective layer extends continuously between a first portion on the upper surface of the insulation layer and a second portion on the first side surface of the insulation layer.

19. The organic light emitting display device according to claim 12, wherein the reflective layer overlapping with the scan line, the data line and the high-voltage supply line is spaced apart from an anode of the light emitting element.

20. A display device, comprising:
a substrate;
a sub-pixel on the substrate, the sub-pixel including a light emitting element disposed in a light emitting area;
a reflective barrier on the substrate and laterally surrounding a perimeter of the light emitting area of the sub-pixel, the reflective barrier including:
an insulation layer having a first sidewall facing the light emitting area of the sub-pixel, a second sidewall opposite the first sidewall, and an upper surface between the first sidewall and the second sidewall;
a reflective layer on the insulation layer, the reflective layer covering the upper surface of the insulation layer and extending from the upper surface of the insulation layer over the first sidewall and the second sidewall of the insulation layer.

21. The display device of claim 20, further comprising:
a bank on the reflective barrier.

22. The display device of claim 21, further comprising:
a driving transistor on the substrate;
a source or drain terminal electrically coupled to the driving transistor; and
a pixel contact hole extending into the insulation layer from the upper surface to either the source terminal or the drain terminal, the pixel contact hole disposed between the second sidewall of the insulation layer and an outer surface of a second insulation layer that is opposite the second sidewall.

23. The display device of claim 22,
wherein the bank overlies and extends at least partially into the pixel contact hole.

24. The organic light emitting display device of claim 1 wherein the bank covers the upper surface, first side surface, and second side surface of the insulation layer.

25. The organic light emitting display device of claim 22 wherein the light-emitting element includes an anode, the anode formed on the upper surface of the insulation layer and extending into the pixel contact hole and over the inner surface of the insulation layer.

26. A display device, comprising:
a substrate, the substrate including a light emitting area and a non-light emitting area;
a sub-pixel on the substrate, the sub-pixel including a light emitting element disposed in the light emitting area, the light emitting element including:
a first electrode;
a second electrode on the first electrode; and
a light emitting layer between the first and second electrodes;
an insulation layer on the substrate laterally surrounding at least three sides of a perimeter of the sub pixel, the insulation layer having an upper surface, and first and second sidewalls extending from the upper surface; and
wherein the first electrode extends to at least partially cover the sidewalls and upper surface of the insulation layer,
wherein the first electrode on the insulation layer forms a mirror wall facing the light emitting area of the sub-pixel, wherein the insulation layer has a reflective layer thereon, the reflective layer configured to reflect light emitted from the light emitting element toward opposite side of the substrate.

* * * * *

UNITED STATES PATENT AND TRADEMARK OFFICE
CERTIFICATE OF CORRECTION

| | |
|---|---|
| PATENT NO. | : 11,227,903 B2 |
| APPLICATION NO. | : 16/656267 |
| DATED | : January 18, 2022 |
| INVENTOR(S) | : Seong-Joo Lee |

It is certified that error appears in the above-identified patent and that said Letters Patent is hereby corrected as shown below:

In the Claims

<u>Column 12, Claim 25, Lines 46-47:</u>
"and extending into the pixel contact hole and over the inner surface of the insulation layer."
Should read:
--and extending into the pixel contact hole.--

Signed and Sealed this
Fifteenth Day of August, 2023

Katherine Kelly Vidal
*Director of the United States Patent and Trademark Office*